US008969892B2

(12) United States Patent
Lim et al.

(10) Patent No.: US 8,969,892 B2
(45) Date of Patent: Mar. 3, 2015

(54) LIGHT EMITTING DEVICE

(75) Inventors: WooSik Lim, Seoul (KR); SungKyoon Kim, Seoul (KR); MinGyu Na, Seoul (KR); SungHo Choo, Seoul (KR); MyeongSoo Kim, Seoul (KR); HeeYoung Beom, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/270,857

(22) Filed: Oct. 11, 2011

(65) Prior Publication Data
US 2012/0049229 A1 Mar. 1, 2012

(30) Foreign Application Priority Data

Oct. 11, 2010 (KR) .................. 10-2010-0098923

(51) Int. Cl.
*H01L 33/00* (2010.01)
*H01L 33/38* (2010.01)
*H01L 33/20* (2010.01)

(52) U.S. Cl.
CPC ............ *H01L 33/382* (2013.01); *H01L 33/0079* (2013.01); *H01L 33/20* (2013.01); *H01L 33/385* (2013.01); *H01L 2933/0016* (2013.01); *H01L 2924/0002* (2013.01)
USPC ................... 257/91; 257/93; 257/98; 257/99; 257/E21.053; 257/E21.351; 257/E33.062; 257/E33.066

(58) Field of Classification Search
USPC ................ 257/84, 91, 93, E21.053, E21.351, 257/E33.062, E33.066; 438/25, 26
See application file for complete search history.

(56) References Cited

U.S. PATENT DOCUMENTS

| 7,859,003 | B2 * | 12/2010 | Jeong .............................. 257/98 |
|---|---|---|---|
| 2002/0081773 | A1 * | 6/2002 | Inoue et al. .................. 438/108 |
| 2005/0012109 | A1 * | 1/2005 | Kohno et al. ................. 257/103 |
| 2006/0097270 | A1 * | 5/2006 | Yuri ............................... 257/88 |
| 2006/0108593 | A1 | 5/2006 | Kim |
| 2009/0095973 | A1 * | 4/2009 | Tanaka et al. .................. 257/99 |
| 2009/0321768 | A1 * | 12/2009 | Chang ............................ 257/98 |
| 2010/0012971 | A1 * | 1/2010 | Hiraoka et al. ............... 257/103 |
| 2010/0120183 | A1 * | 5/2010 | Kim et al. ....................... 438/29 |
| 2010/0163894 | A1 * | 7/2010 | Uemura et al. .................. 257/95 |
| 2010/0226402 | A1 * | 9/2010 | Maeda et al. .............. 372/45.01 |
| 2010/0283070 | A1 * | 11/2010 | Kim et al. ....................... 257/98 |
| 2012/0007101 | A1 * | 1/2012 | Yang et al. ...................... 257/76 |
| 2012/0113656 | A1 * | 5/2012 | Iwanaga et al. ............... 362/382 |

FOREIGN PATENT DOCUMENTS

| EP | 1460694 A | 9/2004 |
|---|---|---|
| EP | 2378572 A | 10/2011 |
| EP | 2458654 A | 5/2012 |

OTHER PUBLICATIONS

European Search Report dated Oct. 10, 2014, for application No. 11184572.3 citing above references.

\* cited by examiner

*Primary Examiner* — Su C Kim
(74) *Attorney, Agent, or Firm* — Lowe Hauptman & Ham, LLP (57) ABSTRACT

Disclosed is a light emitting structure comprising a first semiconductor layer, a second semiconductor layer, and an active layer disposed on between the first and second semiconductor layers, a first electrode electrically connected to the first semiconductor layer and a second electrode electrically connected to the second semiconductor layer. The first semiconductor layer is formed, at an edge portion thereof, with a hole, in which a portion of the first electrode is arranged.

20 Claims, 11 Drawing Sheets

LIGHT EMITTING DEVICE

CROSS-REFERENCE TO RELATED APPLICATION

This application claims the priority benefit of Korean Patent Application No. 10-2010-0098923, filed on in Korea Oct. 11, 2010, the disclosure of which is incorporated herein by reference.

BACKGROUND OF THE EMBODIMENT

1. Field

This relates to a light emitting device.

2. Background

Fluorescent lamps are required to be frequently replaced due to occurrence of a dark spot, short lifespan, etc. Furthermore, they are inconsistent with demand for more environmentally friendly illumination devices due to use of fluorescent materials. For this reason, fluorescent lamps are gradually being replaced by other light sources.

Among light emitting devices, there is great interest in light emitting diodes (LEDs) as an alternative light source. The LED has advantages of semiconductors such as rapid processing speed and low power consumption, is environmentally friendly, and has high energy saving effects. Thus, the LED is a leading next-generation light source. In this regard, practical application of LEDs replacing existing fluorescent lamps is being actively conducted.

Currently, semiconductor light emitting devices such as LEDs are applied to televisions, monitors, notebooks, cellular phones, and various appliances equipped with display devices. In particular, they are widely used as backlight units replacing cold cathode fluorescent lamps (CCFLs).

Recently, light emitting devices are required to have high brightness so that they may be used as light sources for illumination. In order to achieve such high brightness, research into manufacture of a light emitting device capable of achieving uniform current diffusion, and thus, an enhancement in light emission efficiency, is being conducted.

BRIEF DESCRIPTION OF THE DRAWINGS

The embodiments will be described in detail with reference to the following drawings in which like reference numerals refer to like elements wherein.

DETAILED DESCRIPTION

Reference will now be made in detail to the preferred embodiments, examples of which are illustrated in the accompanying drawings.

Advantages and characteristics and methods for addressing the same will be clearly understood from the following embodiments taken in conjunction with the annexed drawings. However, embodiments are not limited and may be realized in other various forms. The embodiments are only provided to more completely illustrate and to render a person having ordinary skill in the art to fully understand the scope. The scope is defined only by the claims. Accordingly, in some embodiments, well-known processes, well-known device structures and well-known techniques are not illustrated in detail to avoid unclear interpretation. The same reference numbers will be used throughout the specification to refer to the same or like parts.

Spatially relative terms, "below", "beneath", "lower", "above", "upper" and the like may be used to indicate the relationship between one device or constituent elements and other devices or constituent elements, as shown in the drawings. It should be understood that the spatially relative terms include the direction illustrated in the drawings as well as other directions of devices during use or operation. For example, in a case in which the device shown in the drawing is reversed, a device arranged "below" or "beneath" the other device may be arranged "above" the other device. Accordingly, the exemplary term, "beneath" may include "below" or "beneath" and "above". The device may be arranged in other directions. As a result, the spatially relative terms may be construed depending on orientation.

Terms used in the specification are only provided to illustrate the embodiments and should not be construed as limiting the scope and spirit of the present invention. In the specification, a singular form of terms includes plural forms thereof, unless specifically mentioned otherwise. In the term "comprises" and/or "comprising" as used herein, the mentioned component, step, operation and/or device is not excluded from presence or addition of one or more other components, steps, operations and/or devices.

Unless defined otherwise, all terms (including technical and scientific terms) used herein may be intended to have meanings understood by those skilled in the art. In addition, terms defined in general dictionaries should not be interpreted abnormally or exaggeratedly, unless clearly specifically defined.

In the drawings, the thicknesses or sizes of respective layers are exaggerated, omitted or schematically illustrated for clarity and convenience of description. Therefore, the sizes of respective elements do not wholly reflect actual sizes thereof.

In addition, angles and directions referred to during description of a structure of a light emitting device are described based on illustration in the drawings. In the description of the structure of the light emitting device, if reference points with respect to the angles and positional relations are not clearly stated, the related drawing will be referred to.

Hereinafter, for further detailed illustration of the shape of the light emitting device according to embodiments, the light emitting device will be described based on a first direction (X) and a second direction (Y) vertical to the first direction (X).

Figure 1:
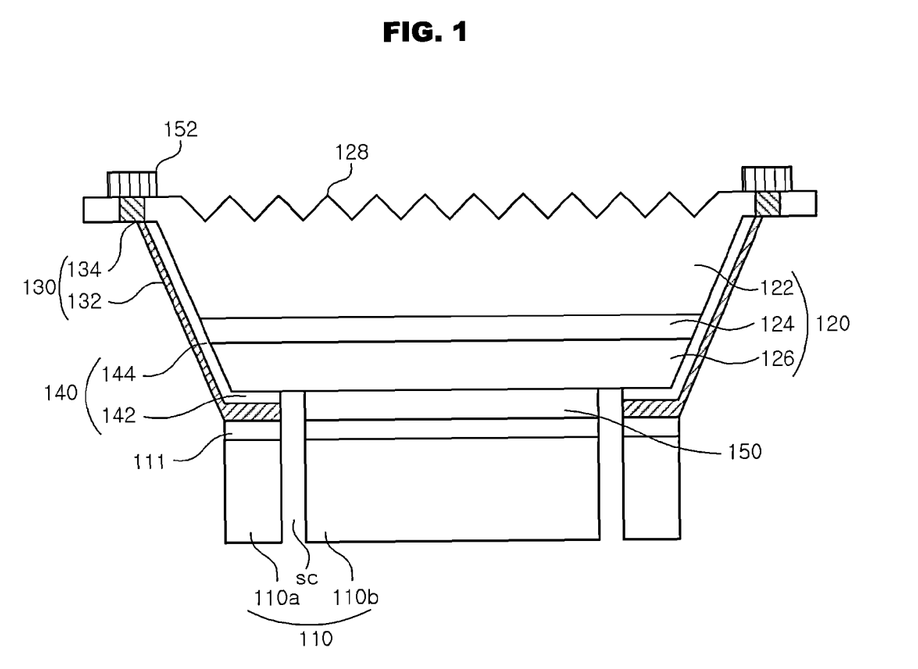
FIG. 1 is a cross-sectional illustrating a light emitting device in accordance with an embodiment as broadly described herein.

FIG. 1 is a cross-sectional illustrating a light emitting device in accordance with an embodiment as broadly described herein.

With reference to FIG. 1, the light emitting device as embodied and broadly described herein may include a substrate 110, and a light emitting structure 120 disposed on the substrate 110.

The substrate 110 may be made of a material having excellent thermal conductivity. Alternatively, the substrate 110 may be made of a conductive material. For example, the substrate 110 may be made of a metal material or a conductive ceramic.

The substrate 110 may have a single-layer structure. Alternatively, the substrate 110 may have a double-layer structure or a multilayer structure having three or more layers.

Although the substrate 110 in the illustrated embodiment has been described as having conductivity, the present disclosure is not limited thereto. For example, the substrate 110 may be nonconductive.

When the substrate 110 is made of a metal material, the material of the substrate 110 may be one selected from gold (Au), nickel (Ni), tungsten (W), molybdenum (Mo), copper (Cu), aluminum (Al), tantalum (Ta), silver (Ag), platinum (Pt), chromium (Cr), and alloys thereof. The substrate 110 may be formed by laminating two or more layers of different materials.

The substrate 110 functions to easily dissipate heat generated from the light emitting device 100, and thus to achieve an enhancement in thermal stability.

When the substrate 110 is made of a semiconductor material, the material of the substrate 110 may be formed using a carrier wafer such as silicon (Si), germanium (Ge), gallium arsenide (GaAs), zinc oxide (ZnO), silicon carbide (SiC), silicon germanium (SiGe), gallium nitride (GaN), or gallium oxide ($Ga_2O_3$).

The substrate 110 may have light transmitting properties. For example, when the substrate 110 is formed to a predetermined thickness or less, using silicon, it may have light transmitting properties. Of course, the substrate 110 is not limited to this condition.

The substrate 110 may be made of a material having high thermal conductivity. The substrate 110 may have a lower index of refraction than a second semiconductor layer 126 in order to achieve an enhancement in light extraction efficiency. Also, the substrate 110 may be provided, at an upper surface thereof, with a patterned sapphire substrate (PSS) structure, in order to further enhance light extraction efficiency. Of course, the substrate 110 is not limited to the above-described condition or structure.

The substrate 110 may function to easily dissipate heat generated from the light emitting device 100, and thus to achieve an enhancement in the thermal stability of the light emitting device 100.

The formation of the substrate 110 may be achieved using an electro-chemical metal deposition method or a bonding method using eutectic metal.

The substrate 110 may include a first substrate portion 110a electrically contacting a first electrode 130, and a second substrate portion 110b electrically contacting a second electrode 150 while being spaced apart from the first substrate portion 110a by a spacing sc.

The first and second substrate portions 110a and 110b are spaced apart from each other by the spacing sc, to be electrically insulated from each other. Voltages of different polarities may be applied to the first and second electrodes 130 and 150, respectively.

Although the first and second substrate portions 110a and 11b are arranged such that the first substrate portion 110a surrounds the second substrate portion 110b in a state of being spaced apart from the second substrate portion 110b by the spacing sc, the disclosure is not limited thereto.

The spacing portion of inner has formed a air, but may be formed a insulating material, the disclosure is not limited thereto.

A bonding layer 111 may be disposed on the first and second substrate portions 110a and 11b of the substrate 110. The bonding layer 111 may achieve easy bonding of first and second electrodes 130 and 150 to the substrate 110.

The bonding layer 111 may be formed to achieve bonding and to avoid diffusion. For example, the bonding layer 111 may be made of at least one of indium (In), tin (Sn), silver (Ag), niobium (Nb), nickel (Ni), aluminum (Au), copper (Cu), platinum (Pt), palladium (Pd), tungsten (W), nickel (Ni), ruthenium (Ru), molybdenum (Mo), iridium (Ir), rhodium (Rh), tantalum (Ta), hafnium (Hf), zirconium (Zr), niobium (Nb), and vanadium (V), or an alloy thereof. Thus, the bonding layer 111 may have a single-layer structure or a multilayer structure.

The second electrode 150, which electrically contacts the second semiconductor layer 126, may be disposed on a portion of the bonding layer 111 arranged on the second substrate portion 110b.

The second electrode 150 may include a reflection layer (not shown) and an electrode layer (not shown). The reflection layer may be disposed on the bonding layer 111, and the electrode layer may be disposed on the reflection layer. Of course, the second electrode 150 is not limited to this arrangement.

The electrode layer may be made of a conductive material. For example, the electrode layer may be made of at least one of nickel (Ni), platinum (Pt), ruthenium (Ru), iridium (Ir), rhodium (Rh), tantalum (Ta), molybdenum (Mo), titanium (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO), and indium zinc oxide (IZO).

Meanwhile, the reflection layer and electrode layer may have the same width. Also, the reflection layer and electrode layer may have different widths or different lengths, or may have different widths and different lengths. Of course, the reflection layer and electrode layer are not limited to the above-described conditions.

The reflection layer and electrode layer may be formed through simultaneous curing procedures. When the reflection layer and electrode layer are simultaneously cured, excellent bonding forces may be obtained.

A current blocking layer (not shown) may be interposed between the second electrode 150 and the light emitting structure 120 in order to avoid a current crowding phenomenon of current supplied from the second electrode 150.

The first electrode 130, which electrically contacts the first semiconductor layer 122, may be disposed on a portion of the bonding layer 111 arranged on the first substrate portion 110a.

The first electrode 130 may be spaced apart from the second electrode 150 in a state of being electrically insulated from the second electrode 150. The first electrode 130 may be made of the same material as the second electrode 120. The first electrode 150 may include a reflection layer and an electrode layer in the same manner as the second electrode 150. Of course, the first electrode 130 is not limited to the above-described arrangement, condition, and structure.

An insulating layer 140 may be interposed between the first electrode 130 disposed on the first substrate portion 110a and the second semiconductor layer 126.

The insulating layer 140 is disposed on a portion of a lower surface of the second semiconductor layer 126 and side surfaces of the light emitting structure 120. The insulating layer 140 may include a first insulating layer 142 disposed on the lower surface portion of the second semiconductor layer 126, and a second insulating layer 144 disposed on the side surfaces of the light emitting structure 120. The side surfaces of the light emitting structure 120 are inclined.

Although each side surface of the light emitting structure 120 is illustrated as being divided into an inclined portion and a stepped portion extending from the inclined portion, the disclosure is not limited thereto.

The first and second insulating layers 142 and 144 may be formed to have an integrated structure or separate structures. The materials of the first and second insulating layers 142 and 144 may be different. Of course, the first and second insulating layer 142 and 144 are not limited to such conditions.

The first insulating layer 142 may be spaced apart from an edge surface of the second electrode 150 by the spacing sc. The second insulating layer 144 may be disposed on the inclined surfaces of the light emitting structure 120. The second insulating layer 144 may extend to a stepped portion of the first semiconductor layer 122. Of course, the disclosure is not limited to the above-described structures.

The second insulating layer 144 does not extend to an upper surface of the first semiconductor layer 122. That is, the stepped portion of the first semiconductor layer 122 may be outwardly exposed. Of course, the disclosure is not limited to such structures.

The first and second insulating layer 142 and 144 may have different widths, although they are not limited thereto.

The first and second insulating layers 142 and 144 may be made of an insulating material. For example, the first and second insulating layers 142 and 144 may be made of silicon oxide ($SiO_2$), silicon nitride ($Si_3N_4$), or the like. The first and second insulating layers 142 and 144 may be made of a metal material having lower electrical conductivity than the first electrode 130 such that they are closer to an insulator than the first electrode 130. Of course, the first and second insulating layers 142 and 144 are not limited to such conditions.

The first electrode 130 may include side surface portions 132 disposed on the insulating layer 140, and extension portions 134 extending through holes (not shown) formed at an edge portion of the first semiconductor layer 122.

The side surface portions 132 may be longer than the insulating layer 140. The side surface portions 132 may be grown through a deposition process.

The side surface portions 132 may extend to respective holes formed at the stepped portion of the first semiconductor layer 122, namely, the edge portion of the first semiconductor layer 122.

The extension portions 134 are connected to the side surface portions 132, respectively, and extend to the upper surface of the first semiconductor layer 122 after passing through the holes, respectively.

An electrode pad 152 may be disposed on an upper surface of each extension portion 134 and an upper surface portion of the first semiconductor layer 122 around the extension portion 134.

Each electrode pad 152 may be disposed on an edge portion of the upper surface of the first semiconductor layer 122. A finger electrode (arm electrode) is also disposed on the edge portion of the upper surface of the first semiconductor layer 122, to be connected to the electrode pad 152. Of course, the disclosure is not limited to such structures.

In addition to the first and second semiconductor layers 122 and 126, the light emitting structure 120 may include an active layer 124 interposed between the first and second semiconductor layers 122 and 126.

The first semiconductor layer 122 may be made of a semiconductor compound. For example, the first semiconductor layer 122 may be implemented using Group III-V or Group II-VI compound semiconductors. The first semiconductor layer 122 may be doped with a first-conductivity-type dopant. For example, the first semiconductor layer 122 may be implemented by an n-type semiconductor layer. The n-type semiconductor layer may be made of one of GaN-based compound semiconductor materials such as GaN, AlGaN, and InGaN, and may be doped with an n-type dopant.

Meanwhile, the electrode pads 152, which are disposed on the edge portion of the upper surface of the first semiconductor layer 122, may be made of a metal having high electrical conductivity, for example, nickel (Ni) or the like. Roughness 128 may be formed at a surface portion of the first semiconductor layer 122 where the electrode pads 152 is not formed or throughout the entire surface portion of the first semiconductor layer 122, using a certain etching method, in order to achieve an enhancement in light extraction efficiency.

As described above, the holes, through which the extension portions 134 of the first electrode 310 extend to contact the electrode pads 152, respectively, may be formed at the edge portion of the upper surface of the first semiconductor layer 122.

That is, the first semiconductor layer 122 includes a first region (not shown) vertically overlapped with the second electrode 150, and a second region (not shown) not overlapped with the first region while including an edge portion where the holes are formed.

The active layer 124 may be disposed beneath the first semiconductor layer 122. The active layer 124 is a region where electrons and holes are recombined. In accordance with recombination of electrons and holes, the active layer 124 transits to a lower energy level, so that it may generate light having a wavelength corresponding to the energy level.

The active layer 124 may be made of, for example, a semiconductor material having a formula of $In_xAl_yGa_{1-x-y}N$ ($0 \le x \le 1$, $0 \le y \le 1$, and $0 \le x+y \le 1$). The active layer 124 may have a single quantum well structure or a multi-quantum well (MQW) structure.

Accordingly, an increased number of electrons gather in a low energy level portion of the quantum well layer. As a result, recombination probability of electrons and holes is increased, so that enhanced light emission effects may be obtained. The active layer 124 may also have a quantum wire structure or a quantum dot structure.

The second semiconductor layer 126 may be disposed beneath the active layer 124.

The second semiconductor layer 126 may be made of a semiconductor compound. For example, the second semiconductor layer 126 may be implemented using Group III-V or Group II-VI compound semiconductors. The second semiconductor layer 126 may be doped with a second-conductivity-type dopant. For example, the second semiconductor layer 126 may be implemented by a p-type semiconductor layer. In this case, the second semiconductor layer 126 may inject holes into the active layer 124. The p-type semiconductor layer may be made of, for example, a semiconductor material having a formula of $In_xAl_yGa_{1-x-y}N$ ($0 \le x \le 1$, $0 \le y \le 1$, and $0 \le x+y \le 1$), for example, GaN, AlN, AlGaN, InGaN, InN, InAlGaN, or AlInN. The p-type semiconductor layer may be doped with a p-type dopant such as Mg, Zn, Ca, Sr, and Ba.

A third semiconductor layer (not shown) may be formed beneath the second semiconductor layer 126. The third semiconductor layer may be implemented by an n-type semiconductor layer.

Meanwhile, the first semiconductor layer 122, active layer 124, and second semiconductor layer 126 may be formed using a metal organic chemical vapor deposition (MOCVD) method, a chemical vapor deposition (CVD) method, a plasma-enhanced chemical vapor deposition (PECVD) method, a molecular beam epitaxy (MBE) method, a hydride vapor phase epitaxy (HVPE) method, or a sputtering method. Of course, the formation method is not limited to the above-described methods.

Contrary to the above-described embodiment, the first semiconductor layer 122 may be implemented by a p-type semiconductor layer, and the second semiconductor layer 124 may be implemented by an n-type semiconductor layer. Of course, the disclosure is not limited to this embodiment.

The first semiconductor layer 122 may include the stepped portion where the holes are formed. The stepped portion may be formed in a procedure in which, in the manufacture of the light emitting device 100, the light emitting structure 120 is grown over a separable substrate (not shown), and is then divided into a plurality of light emitting structures each having a size corresponding to the device, through an isolation process. Subsequently, formation of the holes may be carried out.

Hereinafter, a method for manufacturing the light emitting device (not shown) as described above will be described in detail with reference to FIGS. 2 to 6.

FIGS. 2 to 6 are sectional views illustrating sequential processes of the method for manufacturing of the light emitting device shown in FIG. 1.

Figure 2:
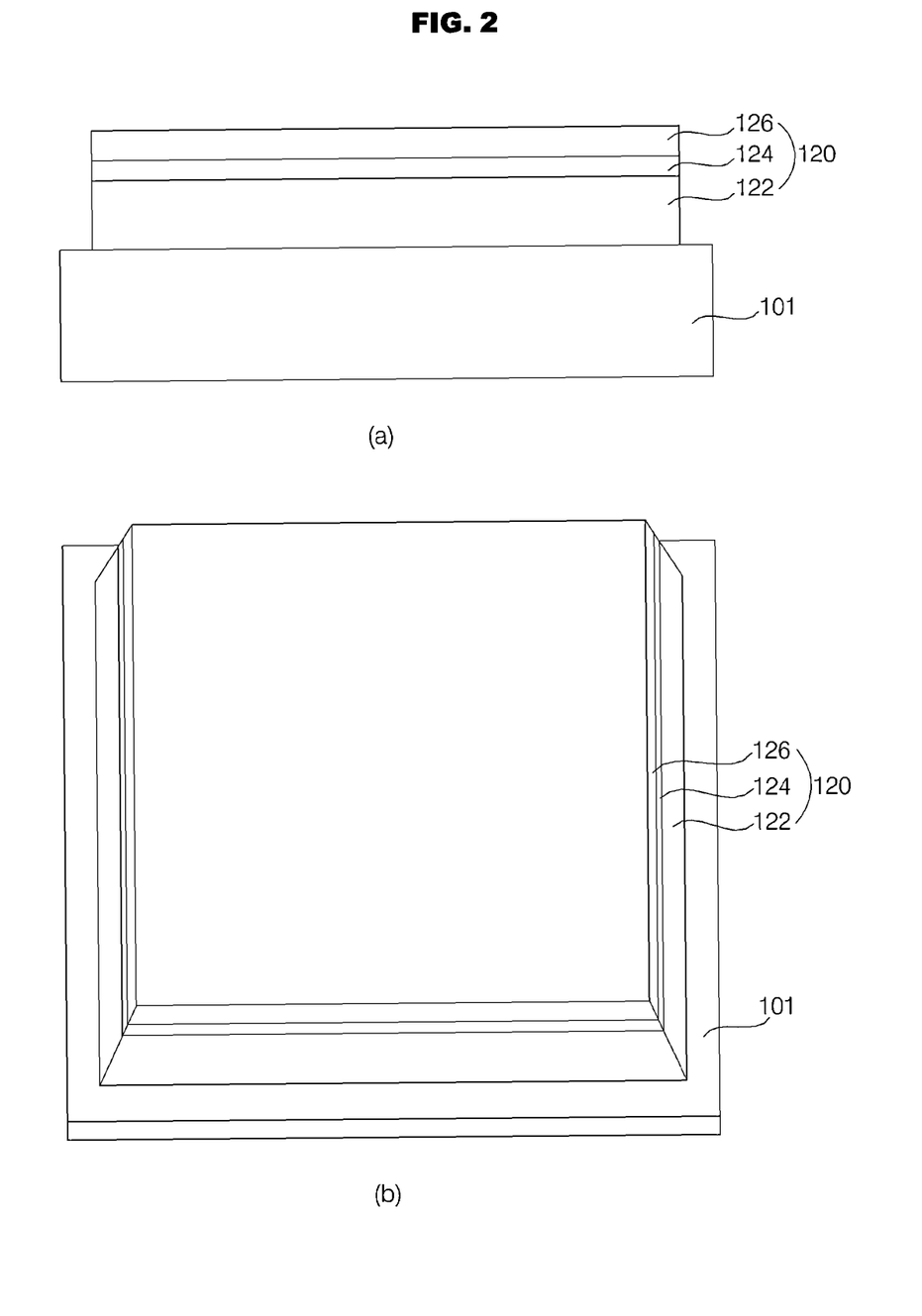
FIGS. 2 to 6 are sectional views illustrating sequential processes of the method for manufacturing of the light emitting device shown in FIG. 1.

With reference to FIG. 2, the light emitting structure 120 may be grown over a separable substrate 101.

The separable substrate 101 may be made of a material capable of achieving easy semiconductor growth.

For example, the material of the separable substrate 101 may be selected from the group consisting of sapphire (Al2O3), GaN, SiC, ZnO, Si, GaP, InP, and GaAs, Although not shown, a buffer layer (not shown) may be formed between the separable substrate 101 and the light emitting structure 120.

The buffer layer may be made of a material capable of reducing the lattice constant difference between the separable substrate 101 and the light emitting structure 120.

For example, the buffer layer may be made of a combination of Group-III and Group-V elements. Alternatively, the buffer layer may be made of one selected from GaN, InN, AlN, InGaN, AlGaN, InAlGaN, and AlInN. The buffer layer may be doped with a dopant.

The light emitting structure 120 may include the first semiconductor layer 122, the active layer 124, and the second semiconductor layer 126. This structure is identical to the structure described with reference to FIG. 1 and, as such, no detailed description thereof will be given.

FIG. 2(a) illustrates sections of the separable substrate 101 and light emitting structure 120. FIG. 2(b) is a perspective view illustrating the separable substrate 101 and light emitting structure 120.

Figure 3:
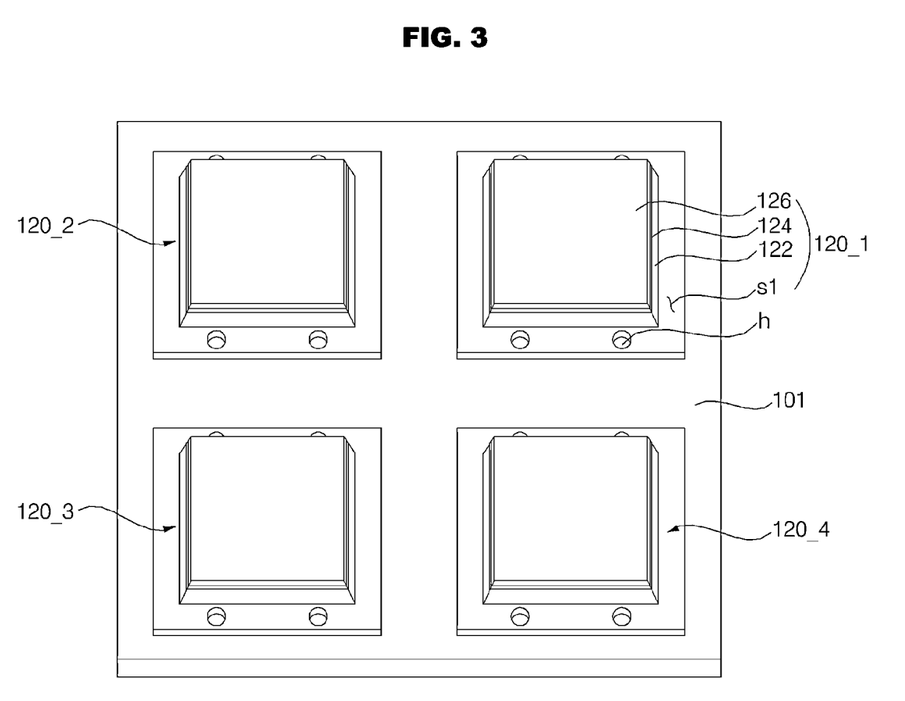

With reference to FIG. 3, the light emitting structure 120 grown over the separable substrate 101 may be divided into first to fourth light emitting structures 120_1 to 120_4 each having a size corresponding to the device, through an isolation process.

At this time, a stepped portion s1 may be formed at each of the first to fourth light emitting structures 120_1 to 120_4, to be stepped from the first semiconductor layer 122.

The stepped portion s1 corresponds to the second region of the first semiconductor layer 122 as described in conjunction with FIG. 1.

The portion of each of the light emitting structures 120_1 to 120_4, at which the second semiconductor layer 126 and active layer 124 are arranged, corresponds to the first region of the first semiconductor layer 122 as described in conjunction with FIG. 1.

In other words, the stepped portion s1, which is included in each of the first to fourth light emitting structures 120_1 to 120_4, may be formed such that a region of the first semiconductor layer 122 is exposed through the stepped portion s1, during an isolation process carried out after growth of the light emitting structure 120.

Although the stepped portion s1 has been described as being formed at an edge portion of the first semiconductor layer 122 in the illustrated embodiment, the disclosure is not limited thereto. For example, the stepped portion s1 may be formed at one side of the first semiconductor layer 122.

Thus, the first to fourth light emitting structures 120_1 to 120_4 may have a stepped shape. At least one hole h may be formed at the stepped portion s1.

The at least one hole h may have a circular shape. Alternatively, the hole h may have a polygonal shape or a shape having a curved edge. Of course, the hole is not limited to such shapes.

The at least one hole h may extend from a first surface of the stepped portion s1 to a second surface of the stepped portion s1 opposite the first surface.

FIG. 3 is a perspective view illustrating the separable substrate 101 and the first to fourth light emitting structures 120_1 to 120_4.

Although the first semiconductor layer 122 included in each of the first to fourth light emitting structures 120_1 to 120_4 is illustrated as being spaced apart from those of the remaining ones of the first to fourth light emitting structures 120_1 to 120_4, the disclosure is not limited thereto.

For example, the first semiconductor layers 122 of the first to fourth light emitting structures 120_1 to 120_4 may not be separated from one another.

Figure 4:
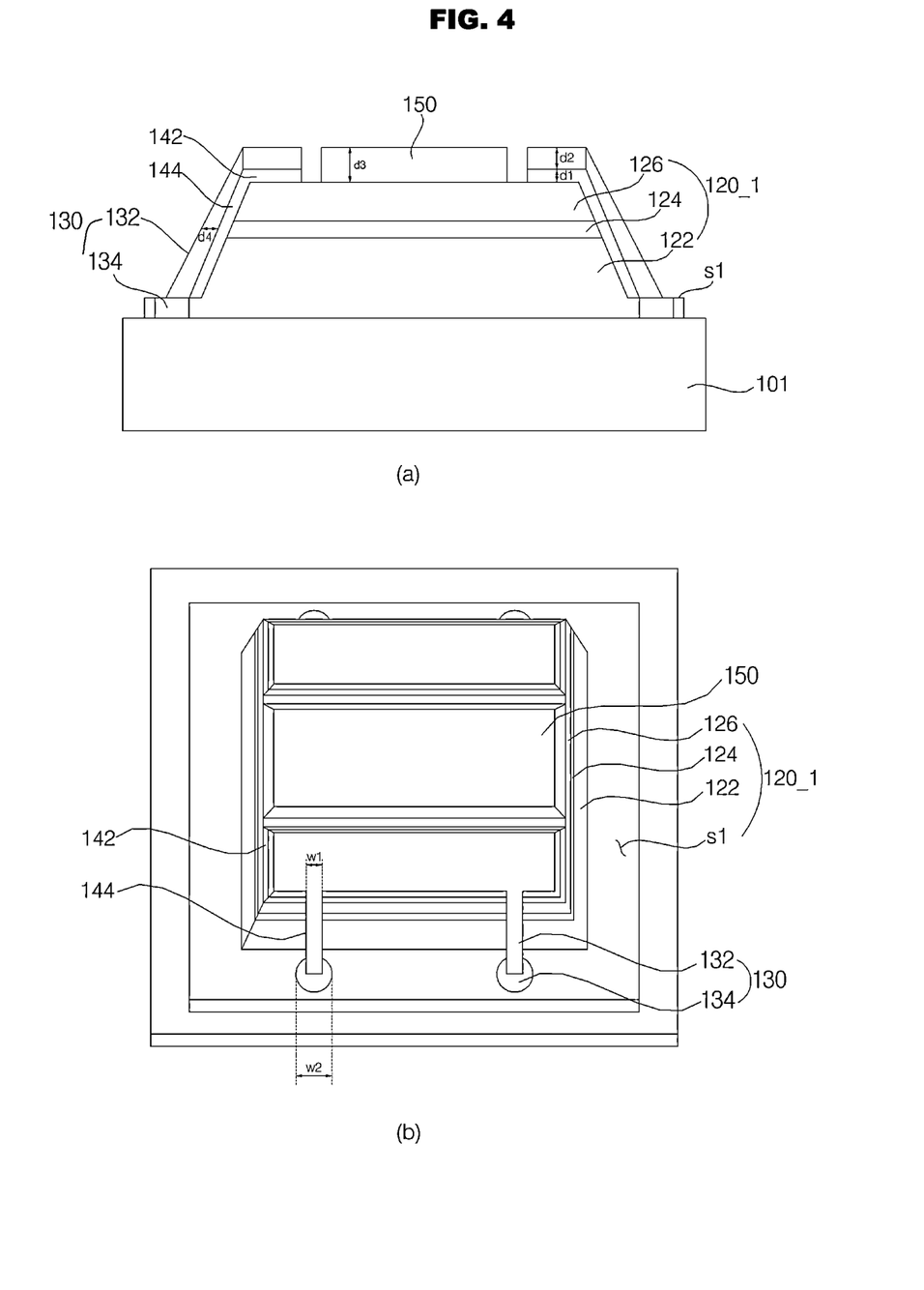

FIG. 4 illustrates one light emitting structure. FIG. 4(a) is a sectional view, whereas FIG. 4(b) is a perspective view.

With reference to FIG. 4, the first light emitting structure 120_1 is illustrated. Hereinafter, manufacture of the light emitting device 100 will be described in conjunction with the first light emitting structure 120_1. Of course, each of the second to fourth light emitting structures 120_2 to 120_4 may be formed into the light emitting device 100 through the same process as the first light emitting structure 120_1.

The second electrode 150 is disposed on a central portion of the second semiconductor layer 126. The first insulating layer 142 may be disposed on edge portions of the second semiconductor layer 126 while being spaced apart from the second electrode 150.

The first insulating layer 142 may have a thickness d1 smaller than a thickness d2 of the first electrode 130, although the disclosure is not limited thereto.

Thereafter, the second insulating layer 144 may be disposed to contact the first insulating layer 142 while extending along the side surfaces of the first light emitting structure 120_1 to the stepped portion s1 of the first semiconductor layer 122.

Thus, the first and second insulating layers 142 and 144 protect the first light emitting structure 120_1. This structure has been described in conjunction with FIG. 1 and, as such, no detailed description thereof will be given.

After formation of the first and second insulating layers 142 and 144, the first electrode 130 may be disposed on the first insulating layer 142.

As described above, the first electrode 130 may include the side surface portions 132, which are disposed on the first and second insulating layers 142 and 144, and the extension portions 134, which extend through the holes h formed at the first semiconductor layer 122.

In this case, the side surface portions 132, which are disposed on the first insulating layer 142, have a thickness d3 smaller than the thickness d2 of the first electrode 130. The thickness d2 of the second electrode 150 may be equal to the sum of the thickness d1 of the first insulating layer 142 and the thickness d3 of the first electrode 130. Of course, the disclosure is not limited to such conditions.

The extension portions 134 are electrically connected to the side surface portions 132, respectively. The extension portions 134 may extend along the inside of the holes h, respectively, namely, through the first semiconductor layer 122.

In this case, the extension portions 134 may have the same shape as the holes h. Each extension portion 134 may have a width w1 greater than a width w2 of each side surface portion 132. Of course, the disclosure is not limited to such conditions.

As the width w1 of each extension portion 134 increases, it may be possible to increase the contact area of the extension portion 134 with the electrode pad 152 disposed thereon after separation of the separable substrate 101.

Each extension portion 134 may be disposed on a non-C-plane of the first semiconductor layer 122, although the disclosure is not limited thereto.

Each side surface portion 132 may have a thickness d4 gradually increasing toward the corresponding extension portion 134, although the disclosure is not limited thereto.

Figure 5:
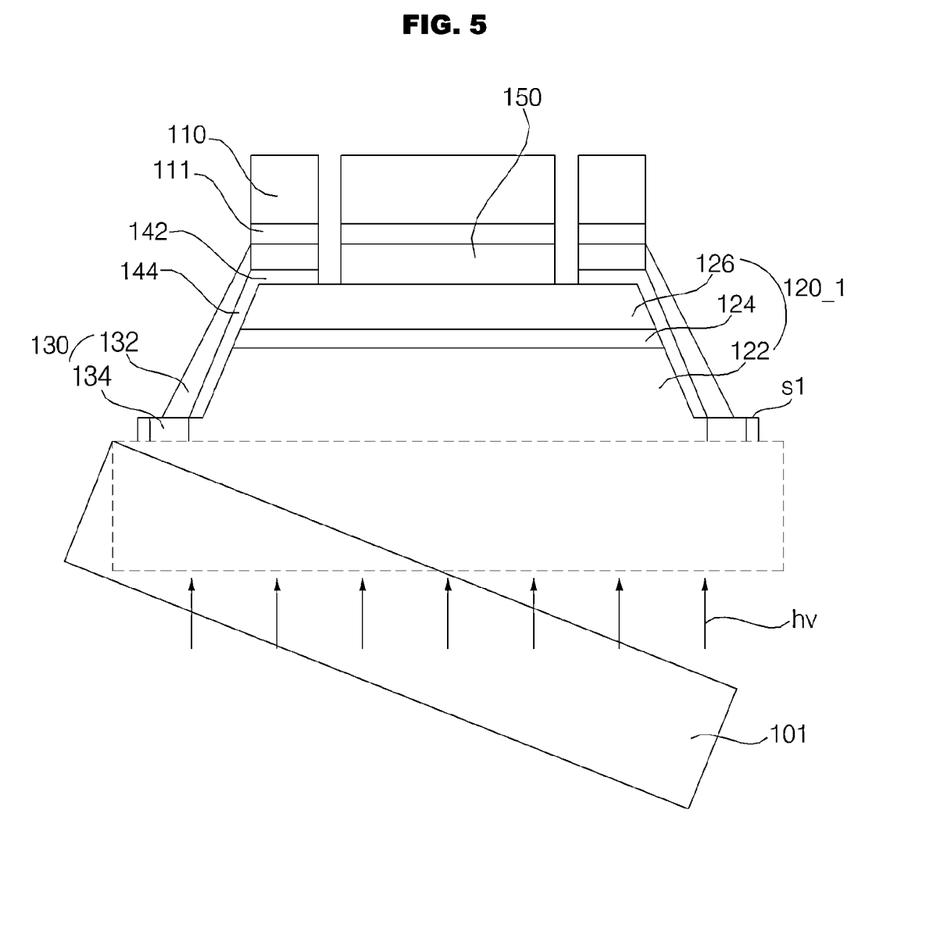

With reference to FIG. 5, the bonding layer 111 and substrate 110 are bonded to the first and second electrodes 130 and 150. Laser beams hv are irradiated onto a lower surface of the separable substrate 101 in order to separate the separable substrate 101 from the first light emitting structure 120_1.

Although the laser beams hv irradiated onto the lower surface of the separable substrate 101 are also irradiated onto the stepped portion s1 of the first semiconductor layer 122, they may not be irradiated onto the second insulating layer 144 and active layer 126 by the stepped portion s1.

The lower surface of the stepped portion s1 of the first semiconductor layer 122 may be damaged by the laser beams hv. However, this damage may exhibit the same effect as roughness formed on a light emitting surface, so that it may not affect light emission efficiency.

Since it is possible to prevent direct irradiation of laser beams hv onto the active layer 124 by the stepped portion s1 of the first semiconductor layer 122, it may be possible to prevent the active layer 124 from being damaged. As a result, it may be possible to easily secure the reliability of the light emitting device 100.

Figure 6:
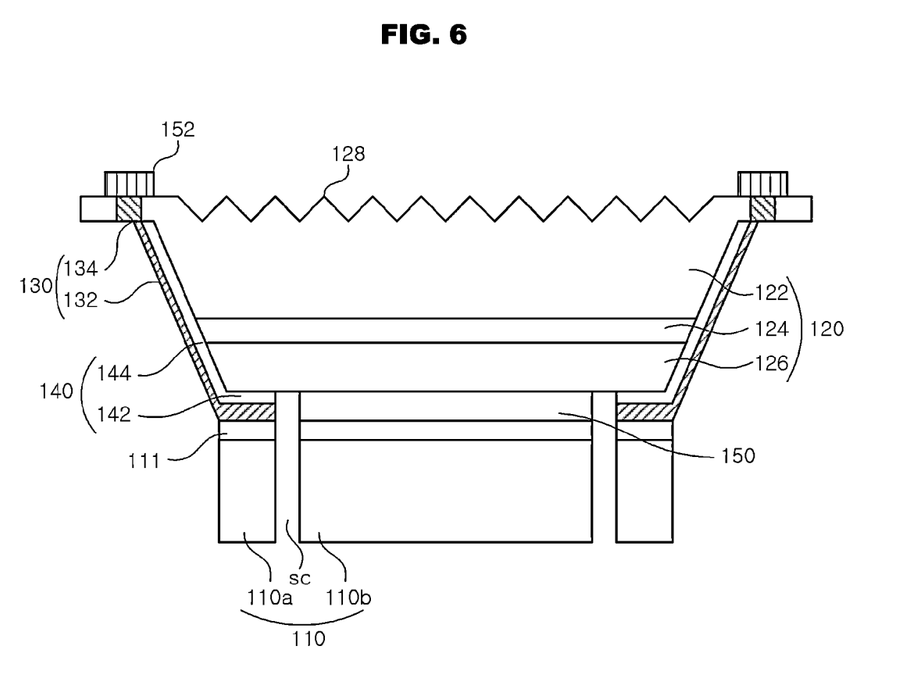

With reference to FIG. 6, a pattern of roughness 128 may be formed on a portion of the first semiconductor layer 122 or throughout the entire portion of the first semiconductor layer 122 after separation of the separable substrate 101. The electrode pads 152 may be bonded after formation of the pattern of roughness 128.

The light emitting device according to the illustrated embodiment may be mounted in a package. Such light emitting device packages are prepared in plural, and are then arrayed on a substrate. Optical members, namely, light guide plates, prism sheets, diffusion sheets, etc., may be arranged on optical paths of the light emitting device packages.

Figure 7:
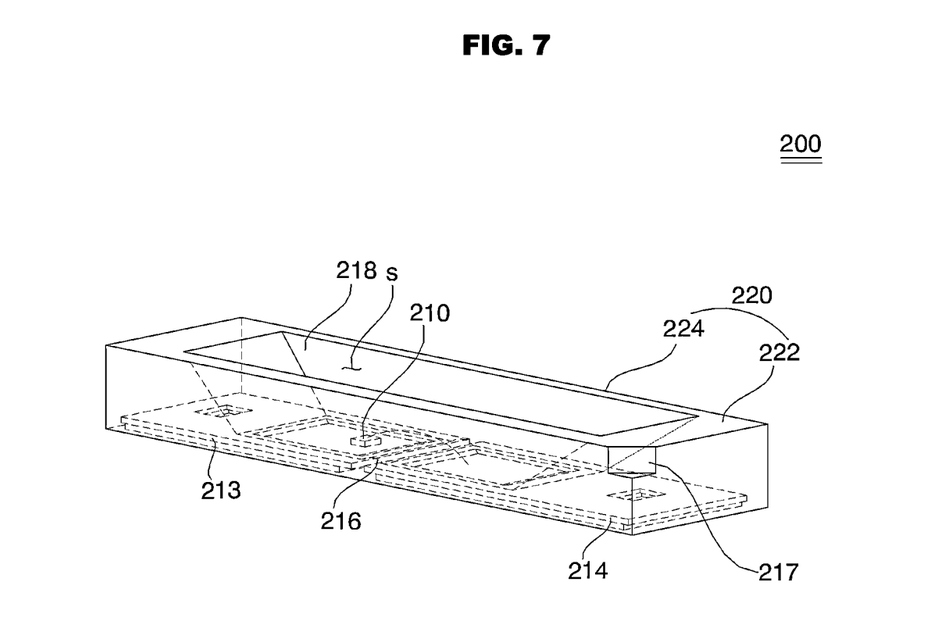
FIG. 7 is a perspective view of a light emitting device package including the light emitting device shown in FIG. 1 in accordance embodiments as broadly described herein.

FIG. 7 is a perspective view of a light emitting device package including the light emitting device shown in FIG. 1 in accordance embodiments as broadly described herein.

FIG. 7 is a perspective view to see through one part of the light emitting device package 200. Although the light emitting device package 200 is a top view in this embodiment, the light emitting device package 200 may be a side view and is not limited thereto.

With reference to FIG. 7, the light emitting device package 200 may include a light emitting device 210 and a body 220 in which the light emitting device 210 is arranged.

The body 220 may include a first barrier rib 222 arranged in a first direction (not shown) and a second barrier rib 224 arranged in a second direction (not shown) which crosses the first direction. The first and second barrier ribs 222 and 224 may be integrally formed and may be formed by an extrusion molding, etching or the like and is not limited thereto.

That is, first and second barrier ribs 222 and 224 may be made of at least one selected from resins such as polyphthalamide (PPA), silicon (Si), aluminum (Al), aluminum nitride (AlN), aluminum oxide (AlOx), photosensitive glass (PSG), polyamide 9T (PA9T), syndiotactic polystyrene (SPS), a metal, sapphire (Al2O3), beryllium oxide (BeO), ceramic, and a printed circuit board (PCB).

The top shape of the first and second barrier ribs 222 and 224 may be selected from a variety of shapes including triangle, rectangle, polygon and circle depending on the application and designs of the light emitting device 210, and is not limited thereto.

In addition, the first and second barrier ribs 222 and 224 form a cavity(s) in which the light emitting device 210 is arranged. The cross-section of cavity(s) may have a cup shape, recessed container shape or the like. The first and second barrier ribs 222 and 224 constituting the cavity(s) may have an inclined face in a lower direction.

In addition, the plan surface of cavity(s) may be selected from a variety of shapes including triangle, rectangle, polygon and circle, but is not limited thereto.

First and second lead frames 213 and 214 may be arranged under the body 220. The first lead frame 213 and the second lead frame 214 contain a metal such as titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), iron (Fe), and alloys thereof. In addition, the first and second lead frames 213 and 214 may have a monolayer or multilayer structure, without being limited thereto.

The inner side of the first and second barrier ribs 222 and 224 may be inclined at a predetermined angle with respect to one of the first and second lead frames 213 and 214. The reflective angle of light emitted from the light emitting device 210 may be varied, depending on the inclination angle. Accordingly, the orientation angle of light discharged to the outside can be controlled. As the orientation angle of light decreases, convergence of light emitted from the light emitting device 210 to the outside increases. On the other hand, as the orientation angle of light increases, convergence of light emitted from the light emitting device 210 to the outside decreases.

The inner side of the body 220 may have a plurality of inclination angles and is not limited thereto.

The first and second lead frames 213 and 214 are electrically connected to the light emitting device 210, are connected to positive (+) and negative (−) electrodes of outer power sources (not shown), respectively, and supply power to the light emitting device 210.

In this embodiment, the light emitting device 210 is arranged on the first lead frame 213, the second lead frame 214 is spaced from the first lead frame 213, and the light emitting device 210 is die-bonded to the first lead frame 213 and is wire-bonded to the second lead frame 214 through a wire (not shown) to receive power from the first and second lead frames 213 and 214.

Here, the light emitting device 210 may be bonded to the first lead frame 213 and the second lead frame 214, which have different polarities.

In addition, the light emitting device 210 is wire-bonded or die-bonded to the first and second lead frames 213 and 214, without being limited in terms of connection formation method.

The light emitting device 210 is arranged in the first lead frame 213 in this embodiment, but is not limited thereto.

In addition, the light emitting device 210 may be adhered to the first lead frame 213 through an adhesive member (not shown).

Here, an insulating dam 216 may be formed between the first and second lead frames 213 and 214 to prevent electric short between the first and second lead frames 213 and 214.

In this embodiment, the insulating dam 216 may have a semi-circular top and the shape thereof is not limited thereto.

The body 213 may be provided with a cathode mark 217. The cathode mark 217 divides polarity of the light emitting device 210 (that is, polarity of the first and second lead frames 213 and 214), and may thus be used to prevent confusion when first and second lead frames 213 and 214 are electrically connected.

The light emitting device 210 may be a light emitting diode. The light emitting diode may be a color light emitting diode to emit colored light such as red, green, blue or white light, or an ultraviolet (UV) light emitting diode to emit ultraviolet light, without being limited thereto. The light emitting device 210 mounted on the first lead frame 213 may be present in plural, at least one light emitting device 210 may be mounted on the first and second lead frames 213 and 214, and the number and position of the light emitting device 210 are not limited.

Here, the light emitting device 210 may be one of light emitting devices shown in FIG. 1, but is not limited thereto.

The body 220 may include a resin material 218 filled in the cavity(s). That is, the resin material 218 may have a double-molded structure or a triple-molded structure and is not limited thereto.

In addition, the resin material 218 may be a film type and include at least one of a phosphor and a light diffusion material.

In addition, the resin material 218 may include a light-transmitting material which contains a phosphor and a light diffusion material, but is not limited thereto.

Figure 8:
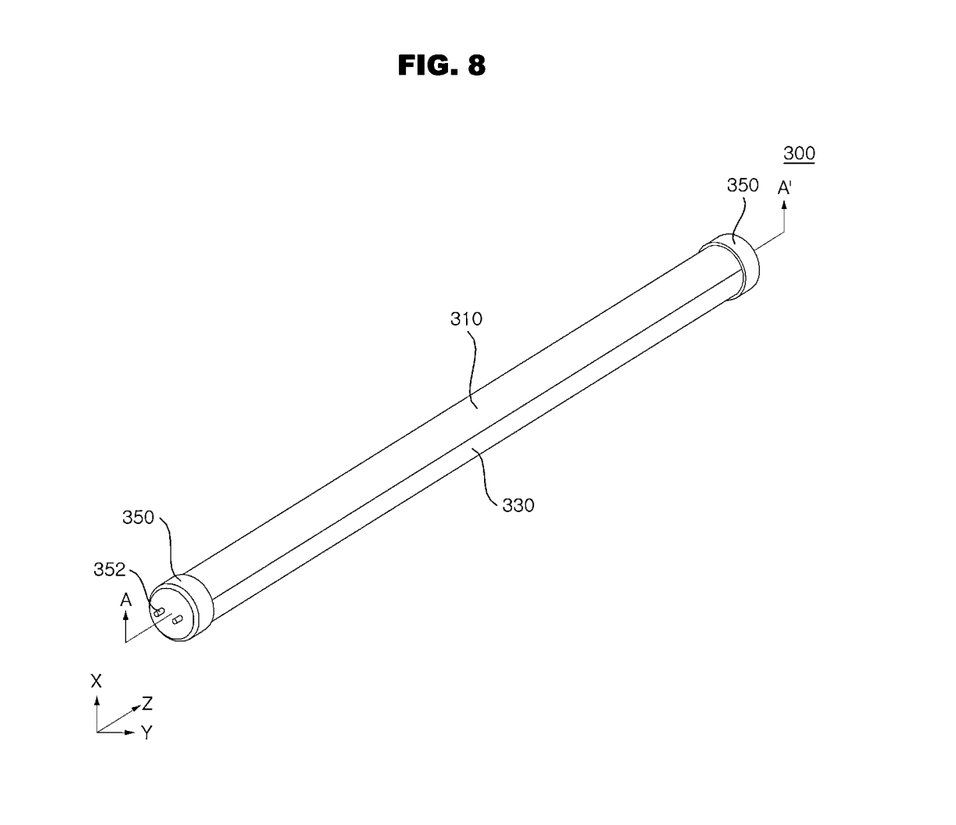
FIG. 8 is a perspective view of a lighting device including a light emitting device in accordance embodiments as broadly described herein.
Figure 9:
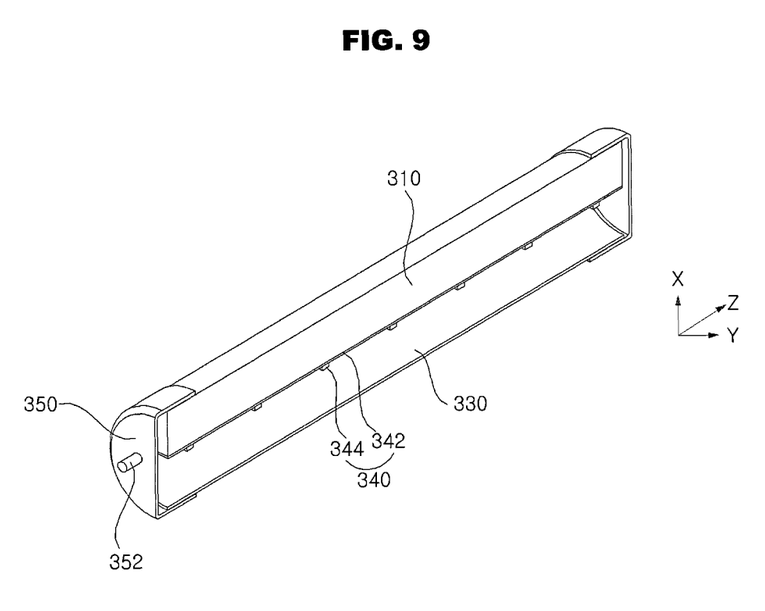
FIG. 9 is a cross-sectional view of the lighting device taken along the line A-A' of the lighting device shown in FIG. 8.

FIG. 8 is a perspective view of a lighting apparatus including a light emitting device in accordance embodiments as broadly described herein, FIG. 9 is a cross-sectional view of the lighting apparatus taken along the line A-A' of the lighting apparatus shown in FIG. 8.

Hereinafter, for better understanding, the lighting apparatus 300 will be described based on a longitudinal direction (Z), a horizontal direction (Y) vertical to the longitudinal direction (Z), and a height direction (X) vertical to the longitudinal direction (Z) and the horizontal direction (Y).

That is, FIG. 9 is a cross-sectional view of the lighting apparatus 300 of FIG. 8, taken along the cross-section of the longitudinal direction (Z) and height direction (X) and seen from the horizontal direction (Y).

With Reference to FIGS. 8 and 9, the lighting apparatus 300 may include a body 310, a cover 330 connected to the body 310 and an end cap 350 arranged at both ends of the body 310.

A light emitting device module 340 is connected to the bottom of the body 310 and the body 310 may be composed of a metal which exhibits superior conductivity and excellent heat release effects in order to discharge heat generated from light emitting device packages 344 each having the light emitting device of FIG. 1 (not shown), through an upper surface of the body 310.

The light emitting device packages 344 may be mounted on a printed circuit board (PCB) 342 in multiple rows while having various colors, to form a multi-color array. The light emitting device packages 344 may be mounted at the same distance, or may be mounted at different distances to enable brightness adjustment, if necessary. The PCB 342 may be a metal core PCB (MCPCB) or a flame retardant-4 (FR4) frame.

Each light emitting device package 344 may include a film formed with a plurality of holes and made of a conductive material.

The cover 330 may have a circular shape to surround the lower surface of the body 310, although the disclosure is not limited thereto.

The cover 330 protects the light emitting device module 340 from external foreign matter, etc. The cover 330 may contain light diffusion particles to achieve anti-glare effects and uniform emission of light generated from the light emitting device packages 344.

At least one of the inner and outer surfaces of the cover 330 may be provided with a prism pattern.

Also, a fluorescent substance layer may be coated over at least one of the inner and outer surfaces of the cover 330.

Since the light generated from the light emitting device packages 344 is outwardly emitted through the cover 330, the cover 330 should have high light transmittance and heat resistance sufficient to endure heat generated from the light emitting device packages 344.

To this end, the cover 330 may be formed of polyethylene terephthalate (PET), polycarbonate (PC) or polymethylmethacrylate (PMMA).

The end cap 350 may be disposed at both ends of the body 310 and function to seal a power supply device (not shown).

Each end cap 350 is provided with power pins 352, so that the lighting apparatus 300 in accordance with the illustrated embodiment may be directly connected to a terminal, which is provided for a conventional fluorescent lamp, without an additional connector.

Figure 10:
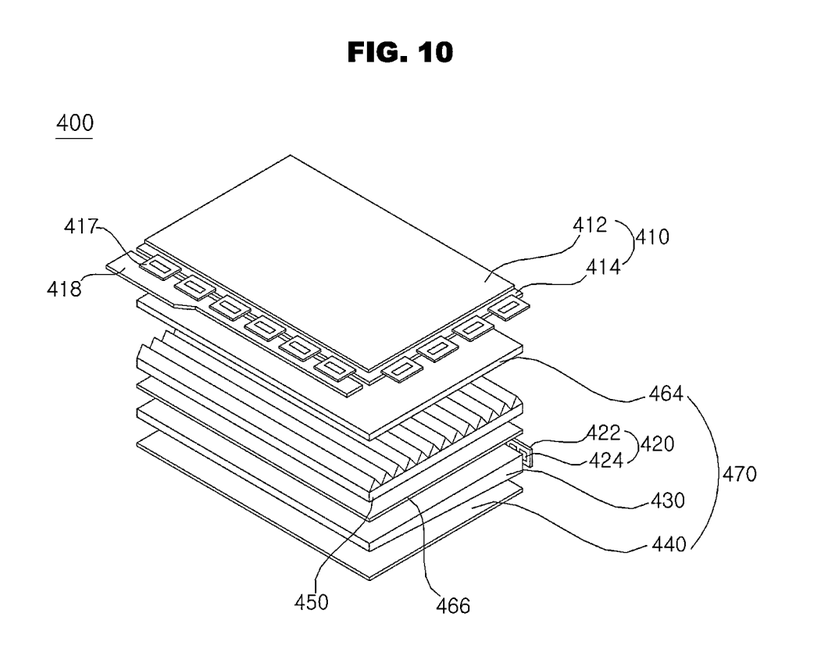
FIG. 10 is a perspective view of a liquid crystal display including a light emitting device in accordance with an embodiment as broadly described herein.

FIG. 10 is a perspective view of a liquid crystal display apparatus including a light emitting device in accordance with an embodiment as broadly described herein.

FIG. 10 illustrates an edge-light type liquid crystal display apparatus 400 which includes a liquid crystal display panel 410 and a backlight unit 470 to supply light to the liquid crystal display panel 410.

The liquid crystal display panel 410 displays an image using light supplied from the backlight unit 470. The liquid crystal display panel 410 includes a color filter substrate 412 and a thin film transistor substrate 514 which face each other such that a liquid crystal is interposed therebetween.

The color filter substrate 412 can realize color images to be displayed through the liquid crystal display panel 410.

The thin film transistor substrate 414 is electrically connected to a printed circuit board 418 on which a plurality of circuit components is mounted through a driving film 417. The thin film transistor substrate 414 responds to drive signals supplied from the printed circuit board 418 and may apply drive voltage from the printed circuit board 418 to liquid crystals.

The thin film transistor substrate 414 includes a thin film transistor and a pixel electrode formed as a thin film on other substrates composed of a transparent material such as glass or plastic.

The backlight unit 470 includes a light emitting device module 420 to emit light, a light guide plate 430 to convert light emitted from the light emitting device module 420 into surface light and supply the light to the liquid crystal display panel 410, a plurality of films 450, 466 and 464 to uniformize brightness of light from the light guide plate 430 and improve vertical incidence, and a reflective sheet 440 to reflect light emitted to the back of the light guide plate 430 to the light guide plate 430.

The light emitting device module 420 includes a plurality of light emitting device packages 424 and a PCB 422 on which the light emitting device packages 424 are mounted to form an array.

Meanwhile, the backlight unit 470 includes a diffusion film 466 to diffuse light incident from the light guide plate 430 toward the liquid crystal display panel 410, a prism film 450 to concentrate the diffused light and thus improve vertical incidence and a protective film 464 to protect the prism film 450.

Figure 11:
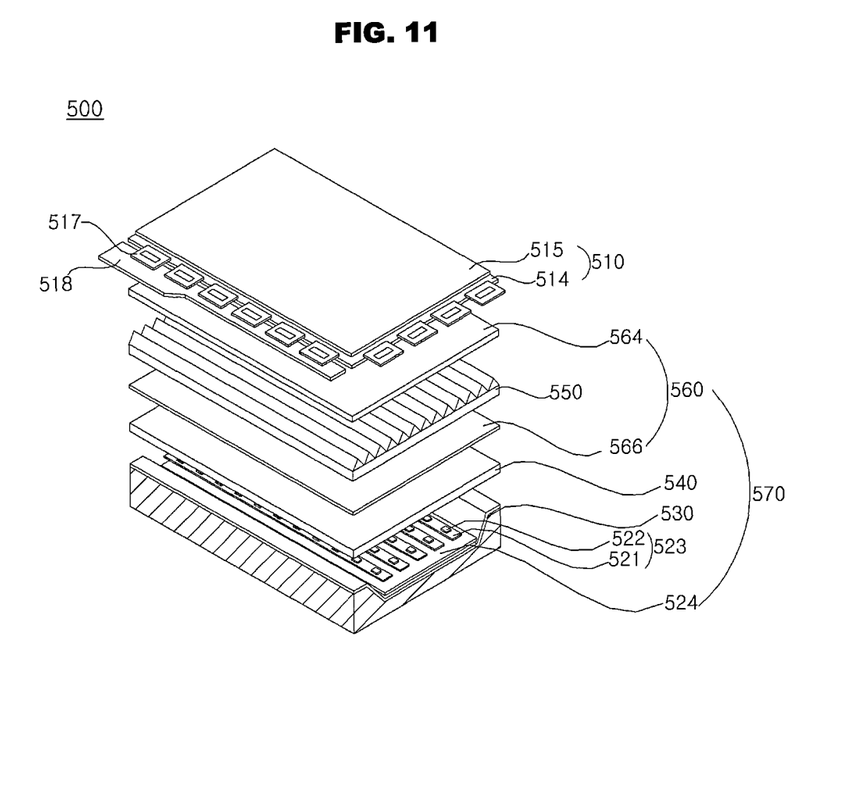
FIG. 11 is a perspective view of a liquid crystal display including a light emitting device in accordance with another embodiment as broadly described herein.

FIG. 11 is a perspective view of a liquid crystal display apparatus including a light emitting device in accordance with another embodiment as broadly described herein.

The contents illustrated and described in FIG. 9 are not mentioned in detail.

FIG. 11 illustrates a direct-type liquid crystal display apparatus 500 which includes a liquid crystal display panel 510 and a backlight unit 570 to supply light to the liquid crystal display panel 510.

The liquid crystal display panel 510 has been described in FIG. 10 and a detailed explanation thereof is thus omitted.

The backlight unit 570 includes a plurality of light emitting device modules 523, a reflective sheet 524, a lower chassis 530 in which the light emitting device modules 523 and the reflective sheet 524 are accepted, and a diffusion plate 540 and a plurality of optical films 560 arranged on the light emitting device modules 523.

Each light emitting device module 523 includes a plurality of light emitting device packages and a PCB 521 on which the light emitting device packages 524 are mounted to form an array.

The reflective sheet 524 reflects light generated by the light emitting device package 522 toward the liquid crystal display panel 510 to improve luminous efficacy.

Meanwhile, light emitted from the light emitting device module 523 is incident on the diffusion plate 540 and an optical film 560 is arranged on the diffusion plate 540. The optical film 560 includes a diffusion film 566, a prism film 550 and a protective film 564.

In the embodiments, the lighting apparatus 400 and liquid crystal display apparatus 500 and 600 may be included in the lighting system and a lighting device including a light emitting device package may be included in the lighting system.

A light emitting device as embodied and broadly described herein may allow which exhibits improved luminous efficacy, stability, and improves safety and reliability.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a light emitting structure comprising a first semiconductor layer, a second semiconductor layer, and an active layer disposed between the first and second semiconductor layers;
a first electrode electrically connected to the first semiconductor layer;
a second electrode electrically connected to the second semiconductor layer;
a substrate disposed beneath the first and second electrodes,
wherein the first semiconductor layer is formed, at an edge portion thereof, with a hole, in which a portion of the first electrode is arranged,
wherein the first semiconductor layer comprises a first region vertically overlapped with the active layer and a second region not overlapped with the first region, the second region including the edge portion, at which the hole is formed,
wherein the substrate comprises:
a first substrate portion contacting the first electrode; and
a second substrate portion spaced apart from the first substrate portion by a spacing, the second substrate portion contacting the second electrode, and
the light emitting device comprises an electrode pad disposed on the first semiconductor layer while contacting the portion of the first electrode arranged in the hole, and
wherein the first substrate portion and the second substrate portion are overlapped with the light emitting structure.

2. The light emitting device of claim 1, further comprising:
an insulating layer disposed on a portion of a lower surface of the second semiconductor layer and side surfaces of the light emitting structure.

3. The light emitting device of claim 2, wherein each of the side surfaces of the light emitting structure has an inclined portion, and
wherein the insulating layer is disposed on the inclined portion.

4. The light emitting device of claim 2, wherein the first electrode comprising:
side surface portions disposed on the insulating layer; and
extension portions extending through holes formed at the edge portion of the first semiconductor layer.

5. The light emitting device of claim 2, wherein the second electrode is disposed on the lower surface of the second semiconductor layer while being spaced apart from the insulating layer.

6. The light emitting device of claim 2, wherein the first electrode is disposed on a lower surface of the insulating layer and side surfaces of the insulating layer.

7. The light emitting device of claim 6, wherein the hole has a width equal to or greater than a width of portions of the first electrode disposed on the side surfaces of the insulating layer.

8. The light emitting device of claim 1, wherein the first semiconductor layer has a roughness, and
wherein the electrode pad is disposed on the roughness.

9. The light emitting device of claim 1, wherein the electrode pad has a width equal to or greater than a width of the hole.

10. The light emitting device of claim 1, wherein at least one of the first and second electrodes comprises at least one of an ohmic layer and a reflection layer, which are disposed on a lower surface of the first semiconductor layer.

11. The light emitting device of claim 10, wherein the at least one of the ohmic layer and the reflection layer has a thickness equal to or smaller than a thickness of the first electrode.

12. The light emitting device of claim 1, wherein the first substrate portion and the second substrate portion are not overlapped with the hole.

13. The light emitting device of claim 1, wherein the first semiconductor layer has a width greater than a width of the substrate.

14. The light emitting device of claim 1, wherein the second electrode is disposed on a center portion of a lower surface of the second semiconductor layer,
the first substrate portion is disposed on a lower surface of the second electrode, and
the second substrate portion is disposed on a lower surface of the insulating layer disposed on an edge portion of the lower surface of the second semiconductor layer.

15. A light emitting device, comprising:
a light emitting structure comprising a first semiconductor layer, an active layer disposed on the first semiconductor layer, and a second semiconductor layer disposed on the active layer, the light emitting structure having side surfaces respectively provided with inclined portions;
an insulating layer disposed on a portion of a lower surface of the second semiconductor layer and the inclined portions;
a first electrode comprising a main portion disposed on the insulating layer, and an extension portion extending from the main portion through the first semiconductor layer;
a second electrode disposed on a portion of the second semiconductor layer where the insulating layer is not disposed, the second electrode being electrically connected to the second semiconductor layer; and
a substrate disposed beneath the second semiconductor layer and formed with a spacing portion for electrically insulating the first and second electrodes,
wherein the substrate comprises:
a first substrate portion, on which the first electrode is disposed; and
a second substrate portion, on which the second electrode is disposed, the second substrate portion being spaced apart from the first substrate portion by the spacing portion,
wherein the first semiconductor layer comprises a first region vertically overlapped with the active layer and a second region not overlapped with the first region, the second region including an edge portion, at which a hole is formed, and
the light emitting device comprises an electrode pad disposed on the first semiconductor layer while contacting a portion of the first electrode arranged in the hole,
wherein the first substrate portion and the second substrate portion are vertically overlapped with the light emitting structure, and
wherein the first substrate portion and the second substrate portion are not vertically overlapped with the hole.

16. The light emitting device of claim 15, wherein the extension portion contacts a non-C-plane of the first semiconductor layer.

17. The light emitting device of claim 15, wherein the first electrode comprises the electrode pad disposed on an upper surface of the first semiconductor layer while contacting the extension portion.

18. The light emitting device of claim 15, wherein the second electrodes comprise at least one of an ohmic layer and a reflection layer, which are disposed on a lower surface of the first semiconductor layer.

19. The light emitting device of claim 18, wherein the at least one of the ohmic layer and the reflection layer has a thickness equal to or smaller than a thickness of the first electrode.

20. A lighting system, comprising:
a light emitting device package comprising a light emitting device, and a body comprising a first lead frame, on which the light emitting device is disposed, and a second lead frame spaced apart from the first lead frame; and
a circuit board, on which the light emitting device package is disposed,
wherein the light emitting device comprising:
a light emitting structure comprising a first semiconductor layer, a second semiconductor layer, and an active layer interposed between the first and second semiconductor layers,
a first electrode electrically connected to the first semiconductor layer,
a second electrode electrically connected to the second semiconductor layer,
a substrate disposed beneath the first and second electrodes,
wherein the first semiconductor layer is formed, at an edge portion thereof, with a hole, in which a portion of the first electrode is arranged,
wherein the first semiconductor layer comprises a first region vertically overlapped with the active layer and a second region not overlapped with the first region, the second region including the edge portion, at which the hole is formed,
wherein the substrate comprises:
a first substrate portion contacting the first electrode; and
a second substrate portion spaced apart from the first substrate portion by a spacing, the second substrate portion contacting the second electrode, and
the light emitting device comprises an electrode pad disposed on the first semiconductor layer while contacting the portion of the first electrode arranged in the hole,
wherein the first substrate portion and the second substrate portion are overlapped with the light emitting structure, and
wherein the first substrate portion and the second substrate portion are not overlapped with the hole.

* * * * *